United States Patent [19]
Aoki et al.

[11] Patent Number: 5,453,990
[45] Date of Patent: Sep. 26, 1995

[54] SWITCHING CIRCUIT HAVING ERROR DETECTION CAPABILITY

[75] Inventors: Yasushi Aoki; Akihiro Shiratori, both of Tokyo, Japan

[73] Assignee: NEC Corporation, Tokyo, Japan

[21] Appl. No.: 49,413

[22] Filed: Apr. 20, 1993

[30] Foreign Application Priority Data

Apr. 20, 1992 [JP] Japan .................................. 4-099074

[51] Int. Cl.$^6$ .............................. G06F 11/00; G01R 31/28
[52] U.S. Cl. .......................... 371/20.1; 371/25.1; 371/48
[58] Field of Search .................................. 371/20.1, 11.2, 371/22.3, 15.1, 48, 25.1

[56] References Cited

U.S. PATENT DOCUMENTS

| | | | |
|---|---|---|---|
| 5,084,874 | 1/1992 | Whetsel, Jr. ........................... | 371/22.3 |
| 5,257,311 | 10/1993 | Naito et al. .............................. | 380/48 |
| 5,258,752 | 11/1993 | Fukaya et al. ........................ | 340/825.8 |
| 5,260,947 | 11/1993 | Posse ...................................... | 371/22.3 |
| 5,267,250 | 11/1993 | Uehora .................................... | 371/57.1 |

OTHER PUBLICATIONS

Kanayama et al "Virnal Pain Management Functions for Broad Band ATM Networks", Globecom 1991, IEEE pp. 1401-1405.

M. A. Henrion et al., "Switching Network Architecture for ATM Broadband Communications", XIII International Switching Symposium, Session A47, 1990.

Primary Examiner—Robert W. Beausoliel, Jr.
Assistant Examiner—Joseph E. Palys
Attorney, Agent, or Firm—Sughrue, Mion, Zinn, Macpeak & Seas

[57] ABSTRACT

Switching circuits are connected between data input lines to and data output lines to connect switch paths between them. A two-input selector is connected to each of the data input lines to supply a data input signal or a test signal to the switching circuits. The selection of the two signals depends on whether the data input line is being used or not. The switch path connections in the switching circuits are controlled by the switching control circuits. Normally, a particular switch path is connected, but while testing, all the switch paths of an unoperated switching circuit which is not normally selected, are connected by a test address signal. The outputs of the switching circuits are detected by an error detector and compared with an expected data sequence, which indicates which output of the switching circuits is detected by the error detector.

14 Claims, 7 Drawing Sheets

FIG. 8

SWITCHING CIRCUIT HAVING ERROR DETECTION CAPABILITY

BACKGROUND OF THE INVENTION

1. Field of the Invention

The present invention relates to a switching circuit used in a switching network like an ATM (Asynchronous Transfer Module) switching system, and more particularly to a switching circuit having a monitor function for detecting switching errors or other problems in the switching circuit.

2. Description of the Related Art

ATMs are expected to be widely utilized in future telecommunication networks. One network architecture using an ATM is described by M. A. Henrion, K. J. Schrodi et al. entitled "Switching Network Architecture For ATM Broadband Communications" XIII International Switching Symposium, Session A47, 1990. The ATM switching network described in the above document uses a plurality of switching matrices for transferring information. Usually, each switching matrix has a plurality of switch paths between input lines and output lines, and the switch paths are selected or transferred by a switching control circuit.

On the other hand, a monitor circuit monitors output data of the ATM switching network by detecting output data of the network. However, the monitor circuit does not monitor the operation of the respective switch path in the switching matrix. Therefore, it is difficult to quickly determine problems in the switching matrix, when the problems are located in an unused switch path. If an unused or unworked switch path is selected for connecting a particular input and output line for a change without knowledge of problems therein, a major disturbance can occur on the ATM switching network.

SUMMARY OF THE INVENTION

The object of the present invention is to provide a switching circuit which can detect problems in any switch path of a switching device such as the switching matrix.

A switching circuit according to the present invention, has a switching device for connecting switch paths between data input lines and data output lines, a test signal generating device for generating a test signal, an expected data sequence generating device for generating an expected data sequence for detecting errors, an error detecting device for detecting a switch error in the switching device by using the output of the switching device and the expected data sequence, and a control device.

A selecting device is connected between the data input lines and inputs of the switching device, for selecting one of the test signal and a data input signal on each of the data input lines. When the data input line is used, the selecting device selects the data input signal. When the data input line is not used, the selecting device selects the test signal. Therefore, the switching device receives either the data input signal or the test signal in accordance with the use condition of the data input lines.

The switching device is controlled by the switching control device. The switching control device generates a switching control signal for controlling the connections of the switch paths in the switching device. The switching control signal includes a normal switching control signal for selecting a particular switch path and a test address signal for selecting all the switch paths for testing.

The detecting device detects the errors or problems in the switching device by comparing outputs of the switching device with the expected signal from the expected data sequence generating device.

The control device controls the expected data sequence generating device to make the expected data sequence equal to the output of the switching device.

DETAILED DESCRIPTION OF THE PREFERRED EMBODIMENTS

Before describing the preferred embodiments of the present invention, a conventional structure of a matrix switch will be described to help in understanding the present invention.

Figure 1A:
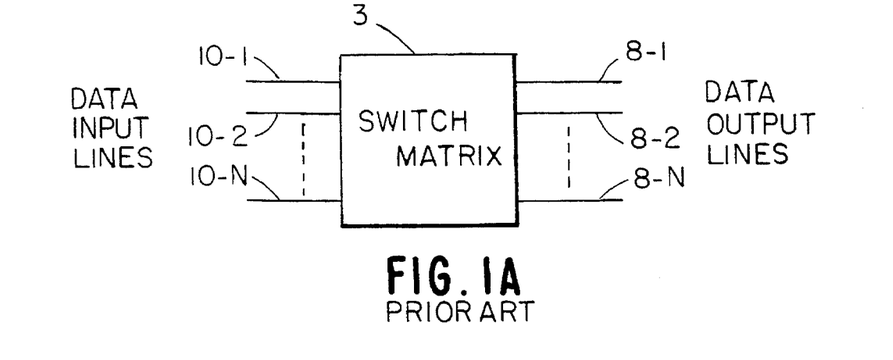
FIGS. 1A and 1B are block diagrams of conventional switching circuits.
Figure 1B:
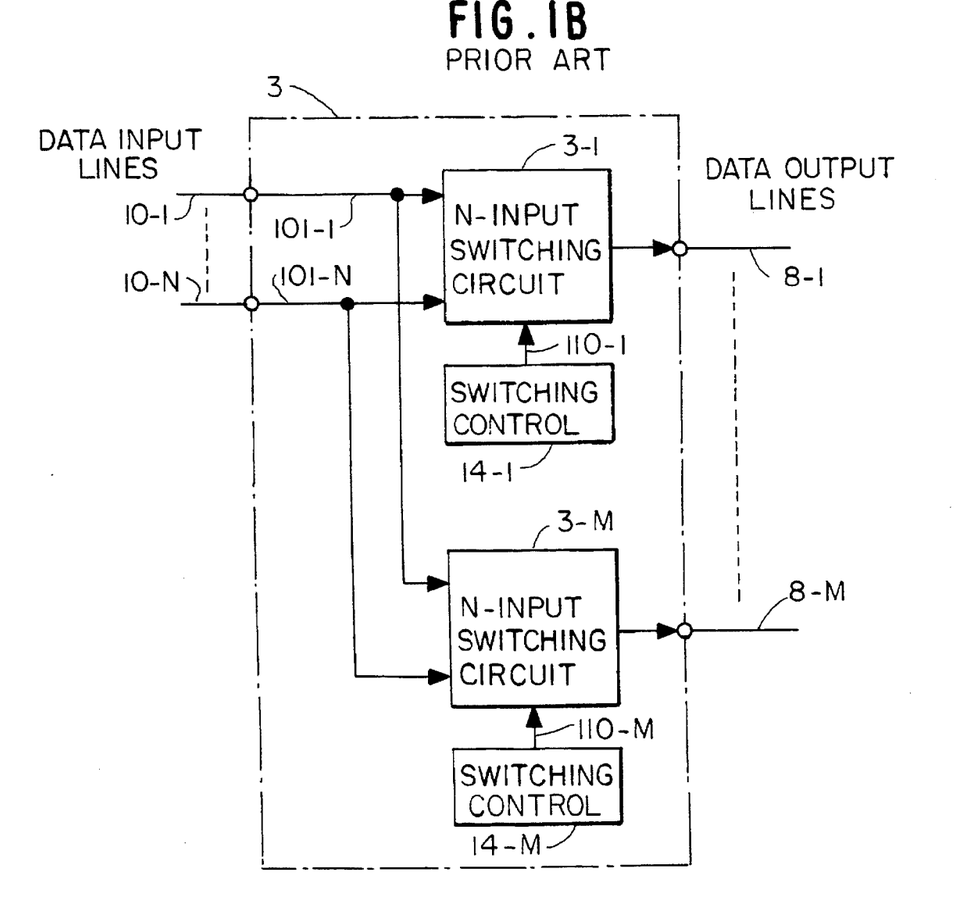

In FIG. 1A, a conventional switch matrix 3 is connected between data input lines 10-1 to 10-N and data output lines 8-1 to 8-M (M is equal to or larger than N). As shown in FIG. 1B, the switch matrix 3 has N-input switching circuits 3-1 to 3-M each of which is connected to the data input lines 10-1 to 10-N and is supplied data input signals 101-1 to 101-N, and switching control circuits 14-1 to 14-M for supplying n-bit switch control signals 110-1 to 110-M to the N-input switching circuits 3-1 to 3-M respectively. Each n-bit switch control signal is stored in advance in the switching control circuits 14-1 to 14-M. This n-bit switch control signal designates the reference number k (k=1,2,3, . . . ,N) of the data input lines 10-1 to 10-N to be selected by the N-input switching circuits 3-1 to 3-M, and the N-input switching circuits make the switch paths between the data input lines and the data output lines based on the n-bit switch control signals 110-1 to 110-M.

However, in such a device, all switch paths in the N-input switching circuits 3-1 to 3-M are not monitored. Only the output states of each switching circuits 3-1 to 3-M are monitored.

Figure 2:
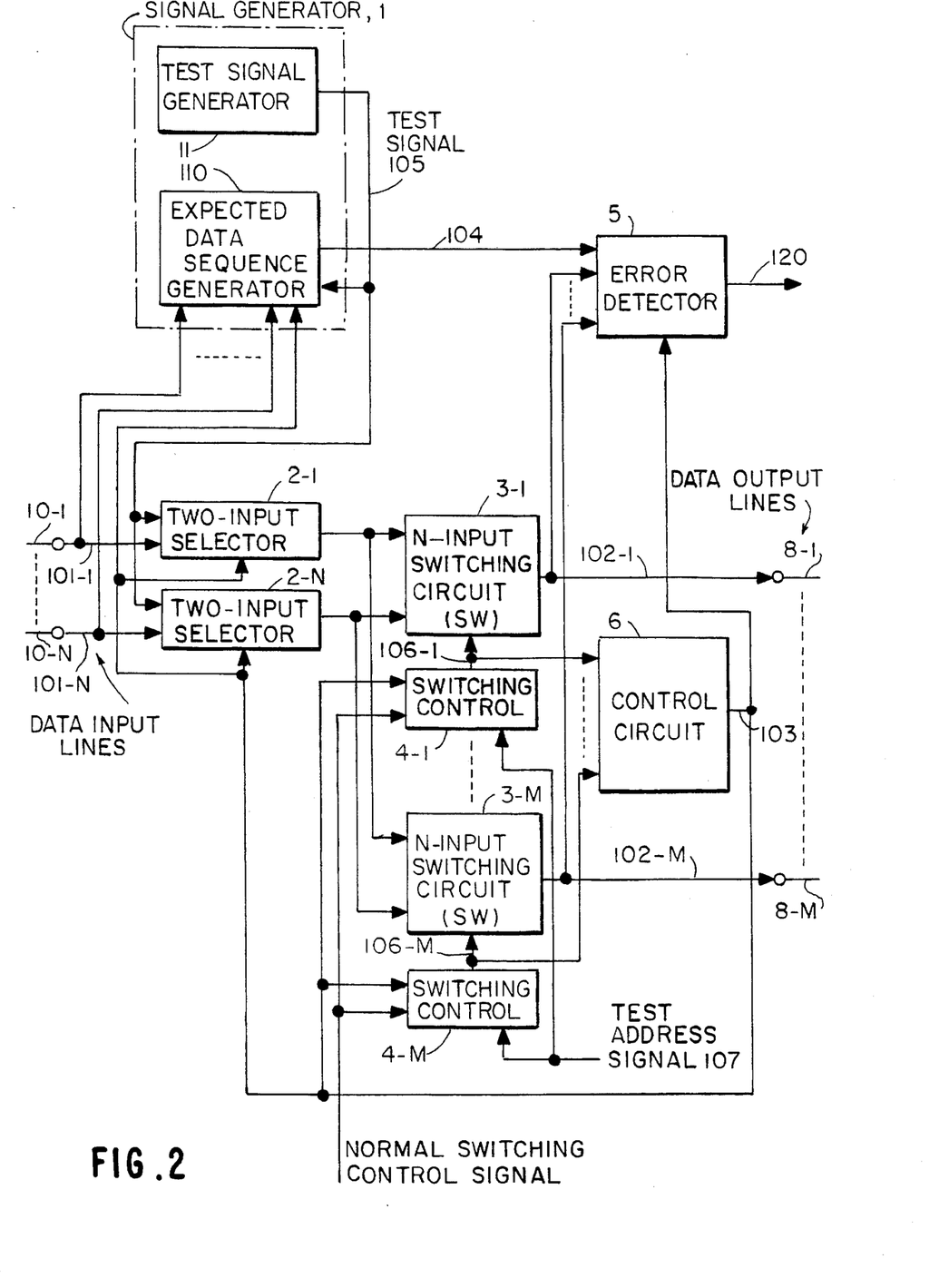
FIG. 2 is a block diagram of a switching circuit according to a preferred embodiment of the present invention.

FIG. 2 is a block diagram of a switching circuit embodying the present invention. In the figure, data input lines 10-1 to 10-N, data output lines 8-1 to 8-M, and N-input switching circuits 3-1 to 3-M are similar to those shown in FIG. 1B, and the other circuits are used for monitoring the N-input switching circuits 3-1 to 3-M in order, to detect problems or switching errors. The switching circuits 3-1 to 3-M are set in advance in an operated state or unoperated state in accordance with the switching control signals 106-1 to 106-M from switching control circuits 4-1 to 4-M. In this embodiment, errors of the switching circuit which is set in the operated state, is detected by monitoring the operating switch path therein, and the errors of another switching circuit which is set in the unoperated state, is detected by monitoring all switch paths therein by using a test address signal 107.

In the switching circuit in FIG. 2, a signal generator 1 has a test signal generator 11 and an expected data sequence generator 110. The test signal generator generates a test signal 105 for testing and the expected data sequence generator 110 generates an expected data sequence 104 which represents the expected output signals 102-1 to 102-M from the switching circuits 3-1 to 3-M. Two-input selectors 2-1 to 2-N select the test signal 105 or data input signals 101-1 to 101-N respectively for input into switching circuits 3-1 to 3-M. The switching control circuits 4-1 to 4-M control the switching circuits 3-1 to 3-M with the switching control signals 106-1 to 106-M respectively. An error detector 5 detects errors or problems in the switch paths in the switching circuits 3-1 to 3-M by comparing the data output signals 102-1 to 102-M with the expected data sequence 104. A control circuit 6 detects the switching control signals 106-1 to 106-M and generates control information 103 for controlling the test signal generator 1, two-input selectors 2-1 to 2-N, switching control circuits 4-1 to 4-M, and error detector 5.

An 8 bit word representing the normal switching control signals is stored in advance in each of the switching control circuits 4-1 to 4-M as the switching control signals 106-1 to 106-M. Each of the normal switching control signals represents the reference number k (k=1,2,3, . . . ,N) of the data input lines 10-1 to 10-N to be selected by the switching control circuits 4-1 to 4-M. However, when there is no normal switching control signal, a "0" (no reference number) is stored as the 8 bit word. If the switching control signal, for example, 106-1, represents "0" the switching circuit 3-1 does not connect any input lines to an output line, that is, the switching circuit 3-1 is set in an unoperated state.

The control circuit 6 detects the reference numbers from the switching control signals 106-1 to 106-M to determine whether the input line to the switching circuit is unused or not and also determines whether the switching circuit is set in the unoperated state or not, and corresponding to the detected results, it generates the control information 103.

The control information 103 consists of many control signals. First, the control circuit 6 generates a first control signal representing which data input lines among the lines 10-1 to 10-N are not being used, and supplies the first control signal to the two-input selectors 2-1 to 2-N. The two-input selectors select the test signal 105 when the first control signal represents the unused state of the data input line. Therefore, either the data input signals 101-1 to 101-N or the test signal 105 are obtained from the switching circuits 3-1 to 3-M.

Moreover, when the control circuit 6 detects the unoperated state of the switching circuit, for example, 3-1, by detecting that an associated switching control signal 106-1 is "0", it generates a second control signal for controlling the switching control circuit 4-1 to select a test address signal 107. The test address signal causes the switching circuit 3-1 to select the input lines 10-1 to 10-N one-by-one. This operation enables the error detection of all switch paths in the unoperated switching circuit 3-1.

Furthermore, the control circuit 6 generates a third control signal, representing which data from the switching circuits 3-1 to 3-M is detected in the error detector 5, and supplies the third control signal to the expected data sequence generator 110. Based on the third control signal, the generator 110 produces the expected data sequence 104 which is expected to equal to the data output signal detected by the error detector 5.

The error detector 5 detects the data output signals 102-1 to 102-M in order, and determines the normality of the respective switch paths in the switching circuits 3-1 to 3-M by comparing the data output signals 102-1 to 102-M with the expected data sequence 104, and then, generates an error output signal 120.

Next, a detail of description of each block in FIG. 2 and the operation thereof will be given.

Figure 3:
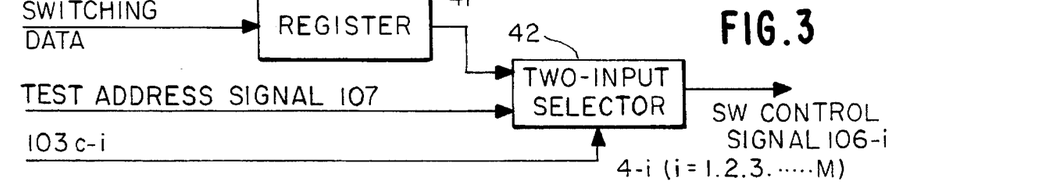
FIG. 3 is a block diagram of a switching control circuit of the switching circuit shown in FIG. 2.

FIG. 3 is a block diagram illustrating the switching control circuit 4-i (i=1,2,3, . . . ,M) in FIG. 2. It has an 8-bit register 41 which stores switching data representative of the reference number of the data input line 10-1, 10-2, . . . , or 10-N, or a "0" (no reference number), and a two-input selector 42 for selecting an output signal of the 8-bit register 41 or the test address signal 107 in accordance with a first control signal $103c–i$ from the control circuit 6. Into the register 41 is written in advance the reference number or a "0". The two-input 42 selector usually selects the register side. However, when the first control signal $103c–i$ represents the switching circuit 3-i as being in the unoperated state, the two-input selector 42 is switched over to the test address signal side. The test address signal 107 varies the address value from 1 to N, which represents the reference numbers of the input lines 10-1 to 10-N. Therefore, all unoperated switch paths in the switching circuit 3-i are attempted to be connected one-by-one by the test address signal 107.

Figure 4:
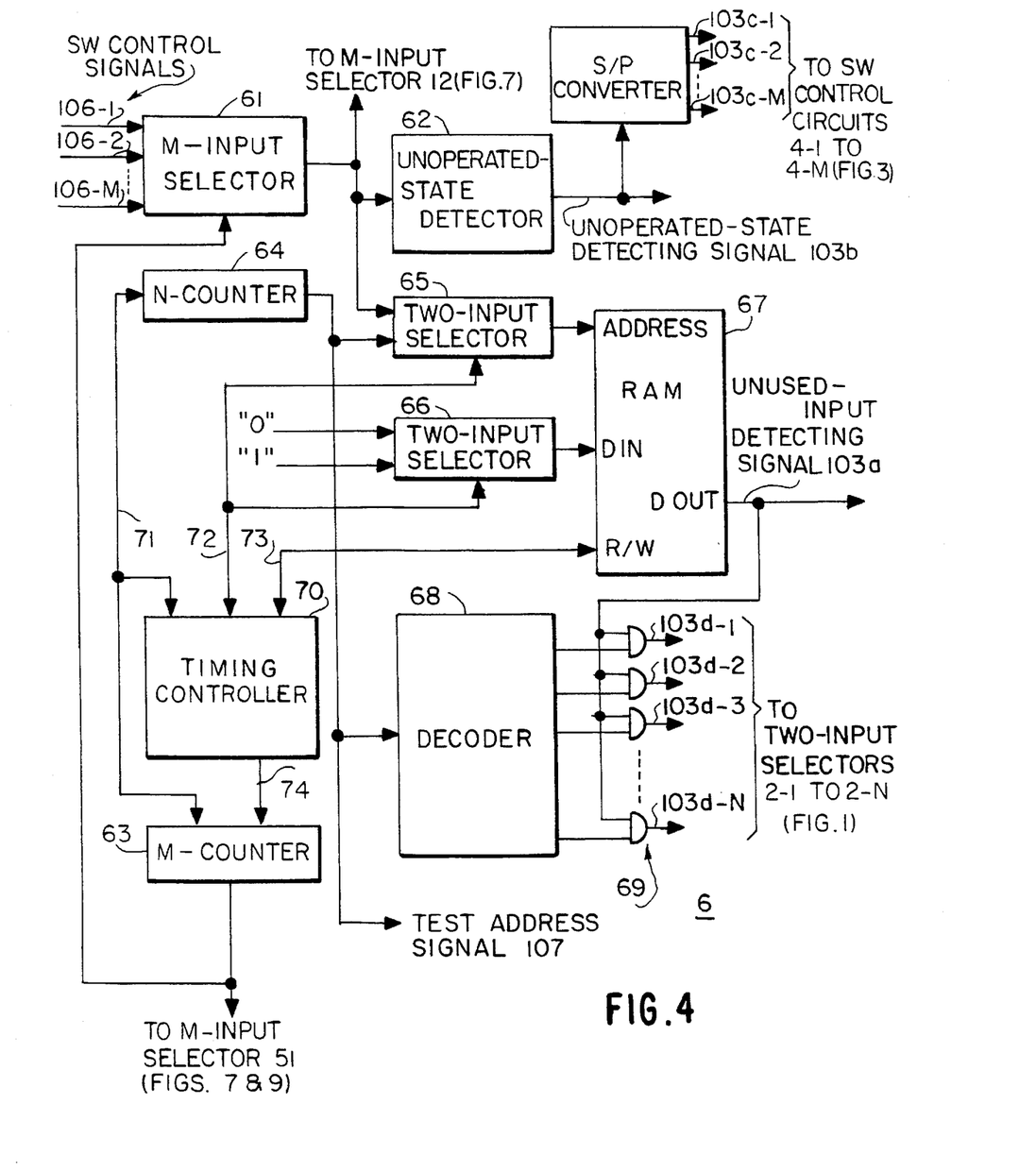
FIG. 4 is a block diagram of a control circuit of the switching circuit shown in FIG. 2.

FIG. 4 is a block diagram illustrating the control circuit 6. It comprises M-input selector 61 for selecting one of the switching control signals 106-1 to 106-M, an unoperated-state detector 62 for detecting whether the switching circuits 3-1 to 3-M are in the unoperated-state or not respectively and for generating an unoperated-state detecting signal $103b$, M-counter 63 for counting from 1 to M, N-counter 64 for counting from 1 to N, two-input selector 65 for selecting one of outputs of the M-input selector 61 and N-counter 64, two-input selector 66 for selecting data of either a "1" or a "0" an N-word one-bit RAM 67 of which the address is supplied from the two-input selector 65 and the input data is supplied from the two-input selector 66, a decoder 68, and a timing controller 70.

Figure 5:
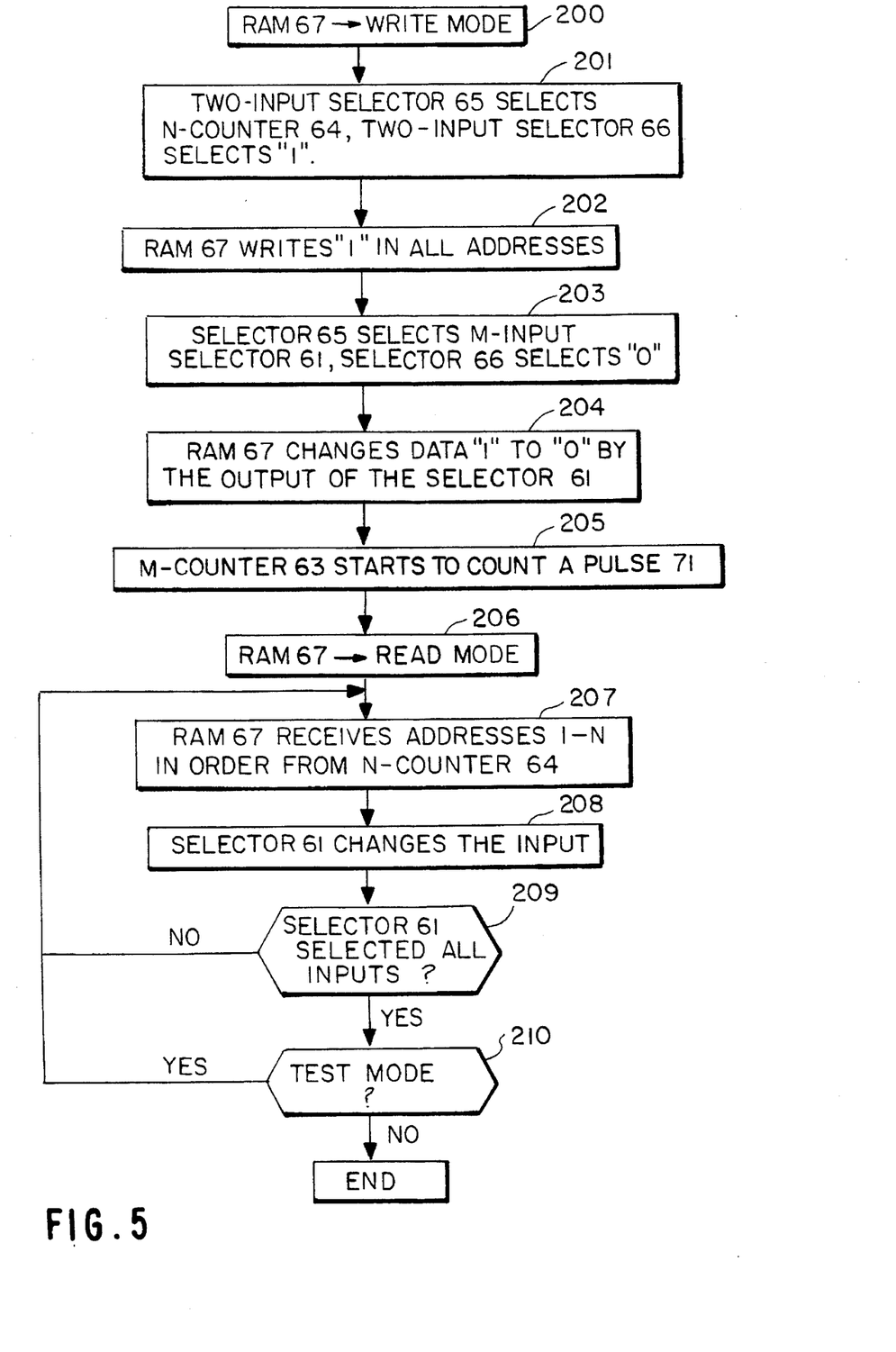
FIG. 5 is a flow chart of an operation of the control circuit shown in FIG. 4.

FIG. 5 is a flow chart showing an operation of the control circuit 6. A first part (steps 200 to 204) of the flow chart shows an operation for storing data, representing whether the data input lines 10-1 to 10-N are used or not respectively, to the RAM 67, and a second part (steps 205 to 210) shows an operation for monitoring the switch paths in the switching circuits 3-1 to 3-M.

First, the RAM 67 is set in a write mode by a read/write (R/W) control signal 73 from the timing controller 70 (step 200), and at the same time, the two-input selector 65 selects an output of the N-counter 64 as the address of the RAM 67 and the two-input selector 66 selects the "1" data as input data of the RAM 67 (step 201). Then, the RAM 67 writes "1" in all addresses 1 to N (step 202).

Next, the two-input selector 65 selects the output of the M-input selector 61 as the address of the RAM 67, and the two-input selector 66 selects the "0" data as the input data of the RAM 67 (step 203). In this condition, the M-input selector 61 selects the switching control signals 106-1 to 106-M one-by-one corresponding to the count values 1 to M of the M-counter 63, so that the address stored in the register 41 (see FIG. 3) can be supplied as the address of the RAM 67. Although the M-counter 63 can count a higher speed pulse 74 and lower speed pulse 71, it counts the higher pulse 74 during the step 204 to finish the writing operation of "0" to the RAM 67 quickly.

Therefore, the RAM 67 changes the previous stored data of "1" to "0" by the address from the M-input selector 61 (step 204). In other words, the RAM 67 stores a "0" in the address corresponding to the reference number of the used data input lines, and stores "1" in the address corresponding to the reference number of the unused data input lines.

Figure 6:
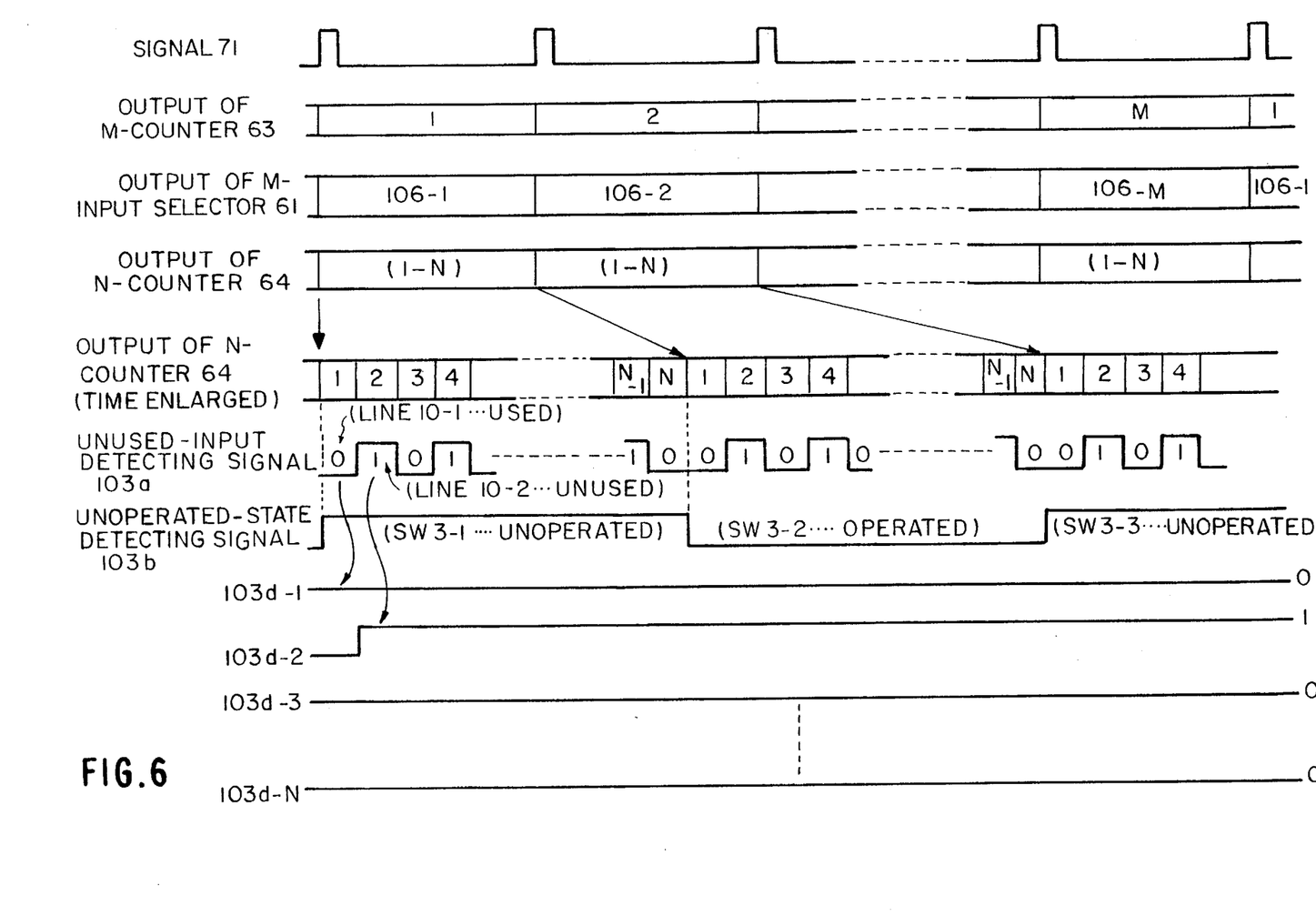
FIG. 6 is a timing chart of an operation of the control circuit shown in FIG. 4.

After the step 204, the control circuit 6 initiates the monitoring of the switch paths in the switching circuits 3-1 to 3-M. FIG. 6 is a timing chart showing the operation of the steps 205 to 210 in FIG. 5. First, the M-counter 63 starts to count the pulse 71 after being reset (step 205). The pulse 71 also serves as a timing signal for the N-counter 64. The M-input selector 61 switches the switching control signals 106-1 to 106-M corresponding to the output of the M-counter 63 as shown in FIG. 6.

On the other hand, the RAM 67 is set in the read mode by the R/W control signal 73 (step 206), and at the same time, the two-input selector 65 selects, as the address of the RAM 67, the outputs 1 to N of the N-counter 64 (step 207) in response to the control signal 72. When the RAM 67 receives the address equivalent to the reference number of the unused data input line, it outputs a "1" from data output terminal as an unused input detecting signal 103a. In FIG. 6, the signal 103a represents that the data input line 10-1 is in a used state, data input line 10-2 in an unused state, input line 10-3 in an used state, . . . , data input line 10-N in an used state.

When the N-counter 64 counts to N, the timing controller 70 again generates the pulse 71 and the M-counter 63 increases the count value by one to change the selection of the M-input selector 61 (step 208), and again, the RAM 67 is read by the output of the N-counter 64.

When the M-counter 63 outputs "i" (i=1,2,3, . . . ,M), the error detector 5 monitors the switching circuit 3-i. Therefore, when the M-counter 63 outputs "M", all switching circuits have been monitored by the error detector 5. In this case, the timing controller 70 checks test mode information (steps 209 and 210). If there is no test mode information, the monitor process is ended. If there is test mode information, steps 207 to 210 are repeated.

The unoperated-state detector 62 detects the output of the M-input selector 61 while the RAM 67 is in writing mode, and determines whether the switching circuits 3-1 to 3-M are respectively in operated-states or unoperated-states, and then outputs the unoperated-state detecting signal 103b as the result. The signal 103b becomes "1" when the switching control signal from the M-input selector 61 is "0" which represents the unoperated-state.

The unoperated-state detecting signal 103b is converted to parallel signals 103c-1 to 103c-M by the series/parallel converter 62A. The parallel signals 103c-1 to 103c-M are generated synchronous with the count value of the M-counter 63, and the signal 103c–i (i=1,2,3, . . . , M) is supplied to the switching control circuit 4-i as the second control signal. When the second control signal 103c–i is "1" the switching control circuit 4-i (see FIG. 3) selects the test address signal 107, that is, output of the N-counter 64.

The unused-input detecting signal 103a, unoperated-state detecting signal 103b and the output of the M-counter 61 (test address signal 107) are supplied to the signal generator 1 as the third control signal for generating the expected data signal 104.

The decoder 68 decodes the output of the N-counter 64 to divide the unused-input detecting signal 103a to each AND gate 69 at every count. Then, the AND gates 69 generate the divided results as first control signals 103d-1 to 103d-N (see FIG. 6), which are respectively supplied to the two-input selector 2-1 to 2-N. When the first control signal 103d–k (k=1,2, . . . ,N) is "1", the two-input selector 2-k selects the test signal 105, and when the first control signal is "0" it selects the data input signal 102-k.

Figure 7:
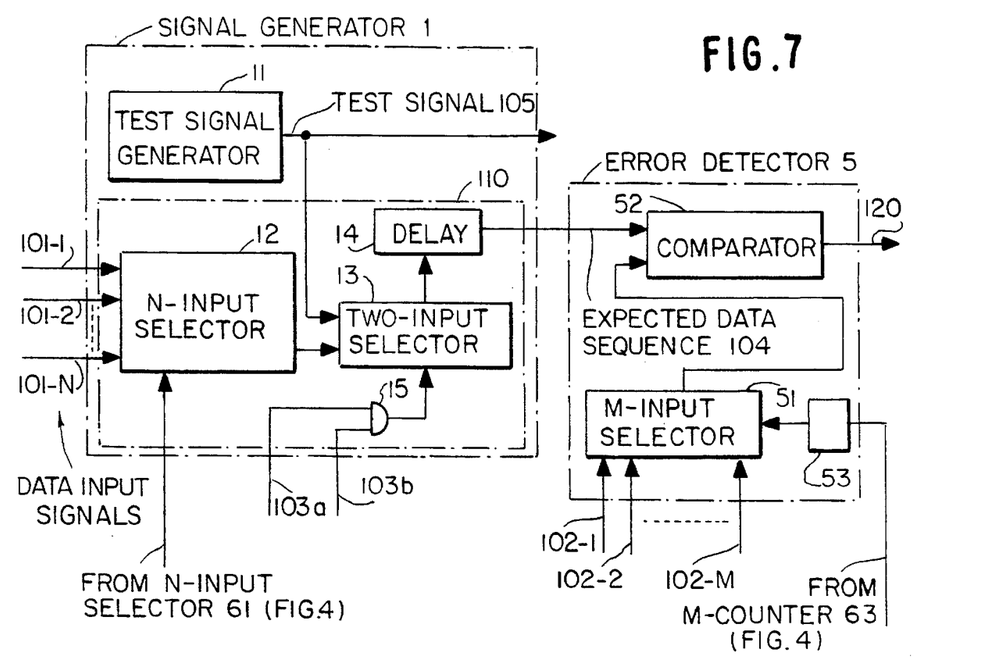
FIG. 7 is a block diagram of a signal generator and an error detector of the switching circuit shown in FIG. 2.
Figure 8:
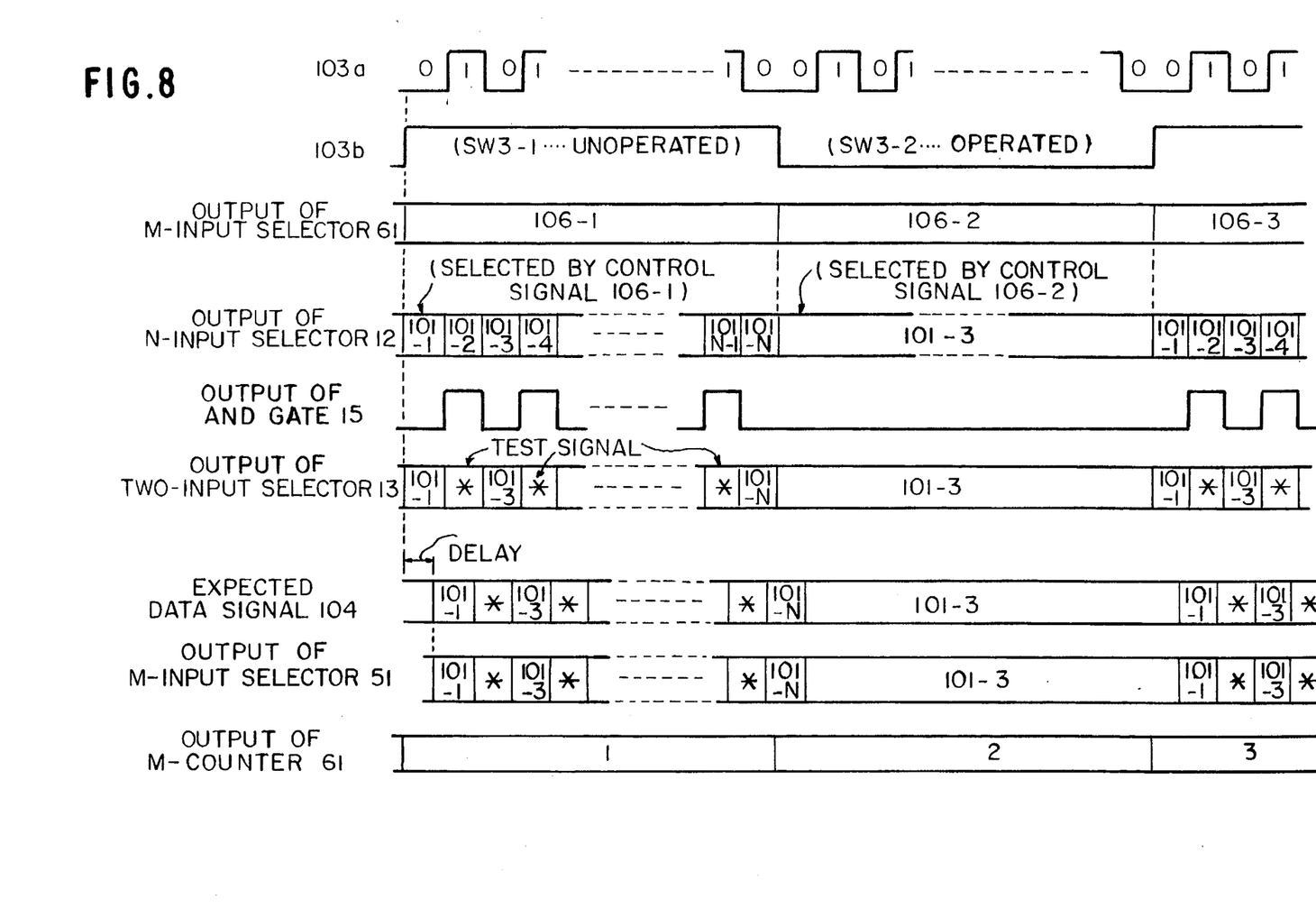
FIG. 8 is a timing chart of an operation of the signal generator and error detector shown in FIG. 7.

FIG. 7 is a block diagram of the signal generator 1 and the error detector 5. FIG. 8 is a timing chart showing the operation of the signal generator 1 and error detector 5.

In the signal generator 1, an expected data sequence generator 110 includes a N-input selector 12, two-input selector 13 delay compensation 14, and an AND gate 15. The expected data sequence 104 is generated in response to the third control signal (signals 103a, 103b and the output of the M-input selector) from the control circuit 6. The error detector 5 has an M-input selector 51 for selecting one of the outputs of the switching circuits 3-1 to 3-M corresponding to the output of the M-counter 63 (see FIG. 4), and a comparator 52 for comparing the output of the M-input selector 51 with the expected data sequence 104.

The test signal generator 11 generates a periodic test signal of a particular code, for example, "10000000". An N-input selector 12 selects a test sample input among the data input signals 101-1 to 101-N corresponding to the output of the M-input selector 61 (see FIG. 4). When the M-input selector 61 outputs the switching control signal 106-1, the test sample input is a data input selected by the switching control signal 106-1. In this embodiment, since the switching control signal 106-1 is a test address signal 107 varying from 1 to N, the N-input selector 12 selects the data input signals 101-1 to 101-N in order. At the same time, the M-input selector 51 selects the output 102-1 of the switching circuit 3-1 by the output "1" of the M-counter 63. A delay 53 is used for compensating the switching delay in the switching circuits.

When the M-input selector 61 outputs the switching control signal 106-2, the test sample input signal selected by the N-input selector 12 is a data input signal (for example 101-3) selected by the switching control signal 106-2. At the same time, the M-input selector 51 selects the output 102-2 of the switching circuit 3-2 in response to the output of "2" of the M-counter 63.

Therefore, the N-input selector 12 and switching circuits 3-1 to 3-M output the same data input signal as each other, and the M-input selector 51 selects the same data input signal selected by the N-input selector 12. The difference between the output of the N-input selector 12 and output of the M-input selector 51 is that the former output does not include the test signal 105.

A two-input selector 13 inserts the test signal 105 into the output of the N-input selector 12 when the N-input selector 12 selects the unused data input line. The test signal 105 is inserted or selected when an output of a AND gate 15, which receives the unused-input detecting signal 103a and unoperated-state detecting signal 103b, is "1". Therefore, the output of the two-input selector 13 is equal to the output of the M-input selector 51.

The delay compensation circuit 14 compensates the switching delay in the switching circuits 3-1 to 3-M by delaying the output of the two-input selector 13, and outputs the expected data sequence 104. The comparator 52 compares the expected data sequence 104 with the output data from the M-input selector 51, and when the two data are identical to each other, the comparator 52 outputs a "1" and when they are not identical, it outputs a "0".

In the above embodiment, while the test mode is set in the control circuit 6, the N-input switching circuit 3-1, 3-2, ... or 3-M, which is in the operated-state, makes a switch path selected by a normal switching control signal stored in the switching control circuit, and the N-input switching circuit, which is in the unoperated-state, makes all switch paths selected by the test address 107 varying 1 to N, and at the same time, the error detector 5 monitors all the N-input switching circuits in order. Therefore, if all the N-input switching circuits 3-1 to 3-M are in the unoperated-states during the test mode, the error detector 5 monitors all switch paths in the N-input switching circuits 3-1 to 3-M. In this case, all output data from the N-input switching circuits are only the test signal 105. On the other hand, if all the N-input switching circuits are in the operated-state, the error detector 5 monitors only the operating switch paths. Moreover, it is possible to determine which switch path has problems by detecting the output of the comparator 52 and the outputs of the M-counter 63 and N-counter 64.

Figure 9:
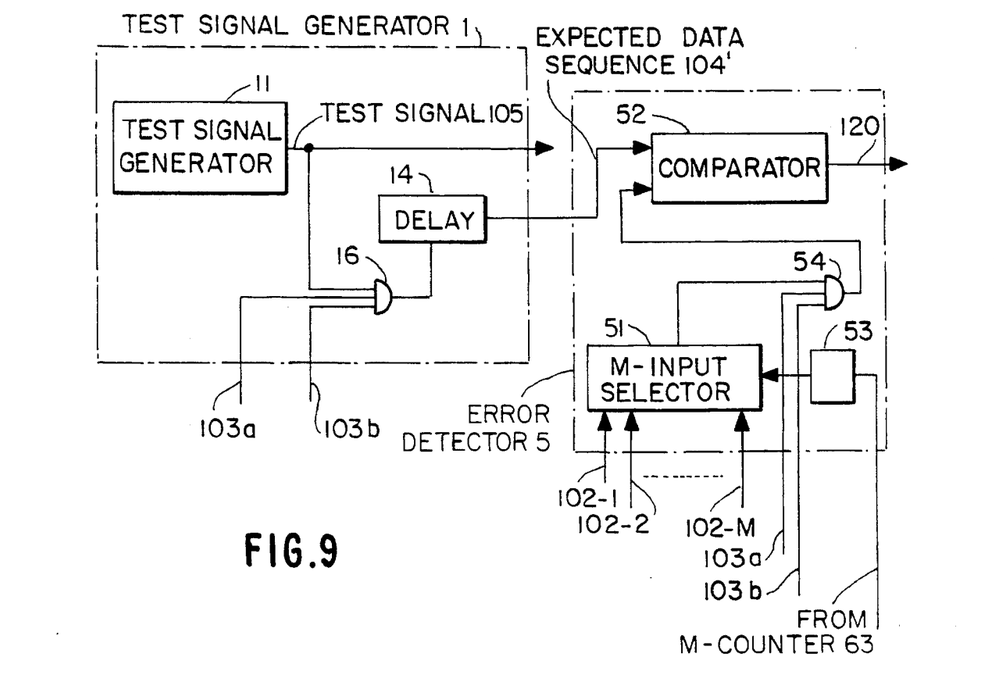
FIG. 9 is a block diagram of a signal generator and error detector of a second embodiment of the invention.

FIG. 9 is a block diagram of a signal generator 1' and an error detector 5' of a second embodiment. The signal generator 1' uses an AND gate 16 in place of the N-input selector 12 (see FIG. 7), two-input selector 13 and gate 15. The AND gate 16 outputs the test signal 105 only when the unused-input detecting signal 103a and unoperated-state detecting signal 103b are "1". Therefore, an expected data sequence 104' consists of the test signal. The error detector 5' adds an AND gate 54 between the M-input selector 51 and comparator 52 to get the test signal from the output of the M-input selector 51. The test signal generator 1' and error detector 5' are used for monitoring the N-input switching circuit which is in the unoperated-state by only the test signal 105. In all other aspect, the second embodiment is similar to the first embodiment.

Although the present invention has been fully described by way of the preferred embodiments thereof with reference to the accompanying drawings, various changes and modifications will be apparent to those having skill in this field. Therefore, unless these changes and modifications otherwise depart from the scope of the patent invention, they should be construed as included therein.

What is claimed is:

1. A switching circuit for switching switch paths between data input lines and data output lines, comprising:

means for generating a test signal;

a plurality of input selecting means, connected to the data input lines respectively, each for selecting the test signal when a data input line is not used and for selecting a data input signal on the data input line when the data input line is used;

switching means, for receiving respective outputs of said plurality of selecting means and for connecting switch paths, in said switching means, between the respective outputs of said selecting means and the data output lines;

switching control means for generating switching control signals for controlling connections of the switch paths in said switching means, each of the switching control signals including one of a normal switching control signal for selecting a particular switch path and a test address signal for selecting all of the switch paths for testing;

means for producing an expected data sequence from a data input signal and the test address signal;

error detecting means for detecting errors in said switching means by comparing outputs of said switching means with the expected data sequence from said expected data sequence generating means; and control means for controlling said expected data sequence producing means to produce an expected data sequence equal to the outputs of said switching means based on the comparison by said error detecting means.

2. The switching circuit claimed in claim 1, wherein the data input lines have first to N-th (N is an integer) lines and the data output lines have first to M-th (M is an integer) lines, and wherein said switching means comprises first to M-th switching circuits, each of which has N-inputs connected to the first to N-th data input lines, via said plurality of input selecting means, and one output connected to each of the first to M-th data output lines.

3. The switching circuit claimed in claim 2, wherein said switching control means comprises a plurality of switching control circuits respectively connected to said first to M-th switching circuits, and wherein said control means comprises:

unused input detecting means, responsive to the switching control signals from said switching control means, for detecting whether each of said first to N-th data input lines is unused, and for generating a first control signal associated with each of the first to N-th data input lines which are unused;

operated-state detecting means, responsive to the switching control signals, for detecting whether each of said first to M-th switching circuits is in an unoperated state, and for generating a second control signal associated with each of the first to M-th switching circuits which is in an unoperated state; and means, responsive to the switching control signals, for generating a third control signal representing which output of said first to M-th switching circuits is detected in said error detecting means.

4. The switching circuit claimed in claim 3, wherein each of said plurality of input selecting means selects one of the test signal and data input signal in response to the first control signal.

5. The switching circuit claimed in claim 3, wherein each of said switching control circuits comprises a selector for selecting one of the normal switching control signal and test address signal in response to the second control signal to generate a switching control signal.

6. The switching circuit claimed in claim 3, wherein said expected data sequence producing means produces the expected data sequence by selecting one of the data input signal and the test signal in response to the third control signal.

7. The switching circuit claimed in claim 3, wherein said unused input detecting means comprises:

N-counter means for counting from 1 to N;

first selector means for performing a selection of outputs of the N-counter means or each of the switching control signals, and for generating an address based on the selection;

second selector means for selecting a "0" or a "1", representing the switching control signal when a corresponding switching control circuit is not operative and when said corresponding control circuit is operative, respectively;

memory means for storing an output of the second selector means in an address represented by the address supplied from said first selector means;

means for generating the first control signal based on the contents of said memory means; and a controller for controlling said first and second selector means and said memory means, so that, during a writing mode of said memory means, the first selector means selects the output of the N-counter means and the second selector means selects one of the "0" and "1" at first, and then, the first selector means selects each of the switching control signals and the second selector means selects the other of the "0" and "1", and during a reading mode of said memory means, said first selector means selects each of the switching controls signals and said memory means is read based on the address from the first selector means.

8. The switching circuit claimed in claim 3, wherein said operated-state detecting means comprises:

a third selector means for selecting each of the switching control signals;

a detector means for detecting whether a switching control signal selected by said third selector means is the normal switching control signal or not and for generating an unoperated-state detecting signal based on the detection; and means for providing the unoperated-state detecting signal with said switching control means as the second control signal.

9. The switching circuit claimed in claim 8, wherein the third control signal includes the switching control signal selected by said third selector means and the first and second control signals.

10. A method for switching switch paths in a switching device between data input lines and data output lines, said switching device comprising a plurality of selecting circuits respectively connected to the data input lines, a plurality of switching circuits each receiving respective outputs of the selecting circuits, a plurality of switching control circuits respectively connected to the switching circuits, a signal generator, an error detecting circuit and a controller, said method comprising the steps of:

generating a test signal;

selecting the test signal when a data input line is not used;

selecting a data input signal on the data input line when the data input line is used;

connecting switching paths, included in each of the switching circuits, between respective outputs of the selecting circuits, supplied to each of the switching circuits, and a data output line of each of the switching circuits;

generating switching control signals for controlling connections of the switch paths, wherein said switching control signals include one of a normal switching control signal for selecting a particular switch path and a test address signal for selecting all of the switch paths for testing;

producing an expected data sequence from a data input signal and the test signal;

detecting errors in the switching circuits by comparing respective outputs of the switching circuits with the expected data sequence; and controlling production of the expected data sequence to produce an expected data sequence equal to the respective outputs of the switching circuits based upon said comparison.

11. The method claimed in claim 10, wherein said controlling step, performed by the controller, comprises the steps of:

detecting, in response to the switching control signals, whether each of the data input lines is unused;

generating a first control signal associated with each of the data input lines which are unused;

detecting, in response to the switching control signals, whether each of the switching circuits is in an operated state;

generating a second control signal associated with each of the switching circuits which is in an unoperated state; and generating a third control signal, in response to the switching control signals, representing which output of the switching circuits is detected by an error detecting circuit.

12. The method claimed in claim 11, wherein each selecting step, performed by each of the selecting circuits, comprises the step of selecting one of the test signal and data input signal in response to the first control signal.

13. The method claimed in claim 11, wherein the generating step, performed by each of the switching control circuits, comprises the step of selecting one of the normal switching control signals and the test signal in response to the second control signal.

14. The method claimed in claim 11, wherein the producing step, performed by the signal generator, comprises the step of selecting one of the data input signal and the test signal in response to the third control signal.

* * * * *